(12) United States Patent  
Ochi et al.

(10) Patent No.: US 7,924,228 B2  
(45) Date of Patent: Apr. 12, 2011

(54) STORAGE MEDIUM WITH BUILT-IN ANTENNA

(75) Inventors: Shozo Ochi, Osaka (JP); Norihito Tsukahara, Kyoto (JP); Kazuhiro Ikurumi, Osaka (JP)

(73) Assignee: Panasonic Corporation, Osaka (JP)

( * ) Notice: Subject to any disclaimer, the term of this patent is extended or adjusted under 35 U.S.C. 154(b) by 388 days.

(21) Appl. No.: 11/993,734

(22) PCT Filed: Jul. 11, 2006

(86) PCT No.: PCT/JP2006/313726  
§ 371 (c)(1),  
(2), (4) Date: Dec. 9, 2008

(87) PCT Pub. No.: WO2007/015353  
PCT Pub. Date: Feb. 8, 2007

(65) Prior Publication Data  
US 2010/0052996 A1 Mar. 4, 2010

(30) Foreign Application Priority Data  
Aug. 3, 2005 (JP) .................. 2005-224868

(51) Int. Cl.  
*H01Q 1/38* (2006.01)  
*H01Q 1/00* (2006.01)  
*H01Q 7/08* (2006.01)

(52) U.S. Cl. .................. 343/700 MS; 343/787; 343/788

(58) Field of Classification Search .......... 343/700 MS, 343/702, 787, 788; 235/451, 487, 492; 174/52.2, 174/52.4  
See application file for complete search history.

(56) References Cited

U.S. PATENT DOCUMENTS

| | | | | |
|---|---|---|---|---|
| 6,974,909 B2 * | 12/2005 | Tanaka et al. | ................. | 174/529 |
| 7,004,399 B2 * | 2/2006 | Maeda et al. | ................. | 235/487 |
| 7,051,933 B1 * | 5/2006 | Nagaoka et al. | ............... | 235/451 |
| 7,549,590 B2 * | 6/2009 | Matsushita et al. | ............ | 235/487 |
| 7,653,919 B2 * | 1/2010 | Potyrailo et al. | .............. | 720/718 |

FOREIGN PATENT DOCUMENTS

| | | |
|---|---|---|
| JP | 58-19506 | 2/1983 |
| JP | 07-335443 | 12/1995 |
| JP | 08-016745 | 1/1996 |
| JP | 11-134459 | 5/1999 |
| JP | 11-168406 | 6/1999 |
| JP | 2001-195553 | 7/2001 |
| JP | 2001-251129 | 9/2001 |
| JP | 2004-213582 | 7/2004 |
| JP | 2004-260586 | 9/2004 |
| JP | 2005-183741 | 7/2005 |

* cited by examiner

*Primary Examiner* — Hoang V Nguyen  
(74) *Attorney, Agent, or Firm* — McDermott Will & Emery LLP (57) ABSTRACT

A storage medium with built-in antenna includes circuit board on which semiconductor element is placed, first and second magnetic layers sandwiching semiconductor element and circuit board, and first and second antenna coils disposed on first and second magnetic layers. First and second antenna coils are connected in parallel on a flexible sheet. First and second antenna coils are folded at the sides of first and second magnetic layers, respectively, and electrically connected to semiconductor element.

12 Claims, 9 Drawing Sheets

STORAGE MEDIUM WITH BUILT-IN ANTENNA

RELATED APPLICATIONS

This application is the U.S. National Phase under 35 U.S.C. §371 of International Application No. PCT/JP2006/313726, filed on Jul. 11, 2006, which in turn claims the benefit of Japanese Application No. 2005-224868, filed on Aug. 3, 2005, the disclosures of which Applications are incorporated by reference herein.

TECHNICAL FIELD

The present invention relates to storage media that allow non-contact reading and memory, and in particular to card-type storage media such as SD (Secure Digital) memory cards that mount a built-in antenna.

BACKGROUND ART

Recently, non-contact IC tags have been now in high demand in many fields in addition to the physical distribution field, and thus even lower costs and higher performance are required. On the other hand, large-capacity memory cards are now in common use, and are broadly used in mobile digital devices, including digital cameras, mobile music players, and mobile information terminals. The further provision of a wireless communication function is expected to broaden the field of application of memory cards. In response to the expectation, an SD memory card with wireless interface function is disclosed in Japanese Patent Unexamined Publication No. 2001-195553 (hereinafter referred to as "Reference patent 1").

The SD memory card disclosed in the above Reference patent 1 has a wireless controller separate from a functional unit as storage medium which is the main function. An antenna module with a loop antenna is connected to this wireless controller via an interface. The flash memory is a flash ROM which is a memory of the SD memory card, and it also stores a driver program for executing a wireless communication function. When an SD memory connected to this antenna module is installed in electronic equipment such as a mobile digital device, communications with external wireless communication equipment are performed via radio waves emitted from the loop antenna, utilizing the wireless communication function of the SD memory card, without any special operations.

However, since the antenna module is attached on the outside of one end of the SD memory card in the above structure, the entire size of the SD memory card becomes larger to accommodate the size of the loop antenna. Consequently, extra space for the loop antenna needs to be secured for installing the SD memory card into electronic equipment such as mobile digital devices, thus hindering downsizing.

Another idea disclosed is to build in the antenna along one end face of a side of the SD memory card where no connecting terminals are provided. This structure is applicable to communications using the 2.4-GHz band. However, for using the 13.56-MHz band, provision of sufficient length of antenna becomes problematic.

As a solution, a thin IC card in which electronic components are mounted on a flexible sheet holding an antenna coil is disclosed in Japanese Patent Unexamined Publication No. H11-134459 (hereinafter referred to as "Reference patent 2.").

The thin IC card disclosed in the above Reference patent 2 is configured with a laminated body that consists of a flexible sheet of resin film holding an antenna coil. The resin film is divided in almost equal intervals in one direction. The laminated body is made by folding this resin film in units of these divisions and integrating them. Spiral conductive patterns, whose spiral centers match when folded and overlaid, are formed on at least one face of unit divisions of the resin film. In addition, the spiral conductive patterns in unit divisions are connected in series via predetermined connectors so that the electric current flows in the same winding direction when the spiral conductive patterns are folded and overlaid.

In cases when radio wave of a medium frequency is used, a remote ID tag configuring an antenna with a conductive pattern is disclosed in Japanese Patent Unexamined Publication No. H11-168406 (hereinafter referred to as "Reference patent 3").

The antenna of the remote ID tag, disclosed in the above Reference patent 3, is formed by folding a flexible printed circuit board. In other words, multiple pattern coils provided on multiple flat sections of the flexible printed circuit board are folded such that two adjacent pattern coils with the flexible printed circuit board or insulating layer in between are wound in reverse. The antenna is configured by connecting one end of each of the pattern coils forming a single coil such that multiple pattern coils are wound in permutation in the same direction.

In this structure, the number of turns in one coil wound in permutation in the same direction can be increased to a predetermined number by increasing the number of foldings of the flexible printed circuit board. Accordingly, the antenna length can be easily extended to approximately 10 m. The antenna can thus be configured with a conductive pattern even if a medium frequency is used. Since the thin flexible printed circuit board is simply folded, the remote ID tag can be made thin.

In the invention disclosed in Reference patent 1, the entire size of the SD memory card becomes larger to accommodate the loop antenna, since the antenna module is attached externally at the end of the SD memory card. This hinders downsizing of mobile electronic devices.

In the inventions disclosed in Reference patents 2 and 3, the number of windings of the antenna is increased by folding the antenna pattern. However, no particular study of antenna characteristics has been carried out to investigate what happens when an LSI such as memory to be installed becomes larger in response to requirements for higher performance of IC card functions. In addition, variation in receiving sensitivity depending on the relative direction of the IC card toward a card reader has not been considered.

SUMMARY OF THE INVENTION

A storage medium with built-in antenna of the present invention includes a semiconductor element having a communication function for sending and receiving signals to and from external equipment via an antenna coil, a circuit board on which this semiconductor element is mounted; a first magnetic layer and second magnetic layer that sandwich the semiconductor element and the circuit board and are larger than the semiconductor element; a first antenna coil disposed on the first magnetic layer; and a second antenna coil disposed on the second magnetic layer. The first antenna coil and the second antenna coil are connected in parallel on a single flexible sheet, and are folded at the sides of the first magnetic layer and the second magnetic layer, respectively, so as to connect to the semiconductor element.

This structure enables the sending and receiving of signals of the same sensitivity regardless of whether the surface or rear face of the storage medium with the built-in antenna faces the card reader, thus improving user-friendliness. In addition, the magnetic layer provided between the semiconductor element and the first antenna coil and between the semiconductor element and the second antenna coil absorbs electromagnetic waves. As a result, the sending and receiving characteristic can be stabilized even if the semiconductor element is large or configured with multiple semiconductor chips.

REFERENCE MARKS IN THE DRAWINGS 12, 80 Circuit board
14, 82 Control LSI
15, 83 Semiconductor element
16, 84 Semiconductor memory
21, 51, 91 Flexible sheet
22, 50, 100 Mounting area
24, 26, 30, 32, 52, 54, 56, 58, 92, 94, 96, 98
   Coil pattern
25, 53, 93 First antenna coil
28, 60, 102 Interval adjustment section
31, 57, 97 Second antenna coil
34, 62, 64, 106, 112
   Rear wiring conductor
36, 66, 68, 70, 72, 108, 110
   Surface wiring conductor
40, 86 First magnetic layer
42, 88 Second magnetic layer
44, 90 Insulating adhesive
46, 104 Casing
48, 74, 114, 141, 161, 821, 841
   Bump
121 External connecting terminal
221, 501, 1001 Connecting terminal
222, 242, 262, 302, 322, 522, 542, 562, 582, 922, 942, 962, 982, 1002
   Through conductor
241, 261, 301, 321, 521, 541, 561, 581, 921, 941, 961, 981
   Coil
A, B, C, D, E, F, G, K, L, M, N, P, Q, R, S, T, U
   Folding line

DETAILED DESCRIPTION OF PREFERRED EMBODIMENTS

Exemplary embodiments of the present invention are described below with reference to drawings. In the drawings, dimensions for thickness, width, and length are magnified to facilitate description. In addition, the same components are given the same reference marks to omit duplicate descriptions.

First Exemplary Embodiment

Figure 1A:
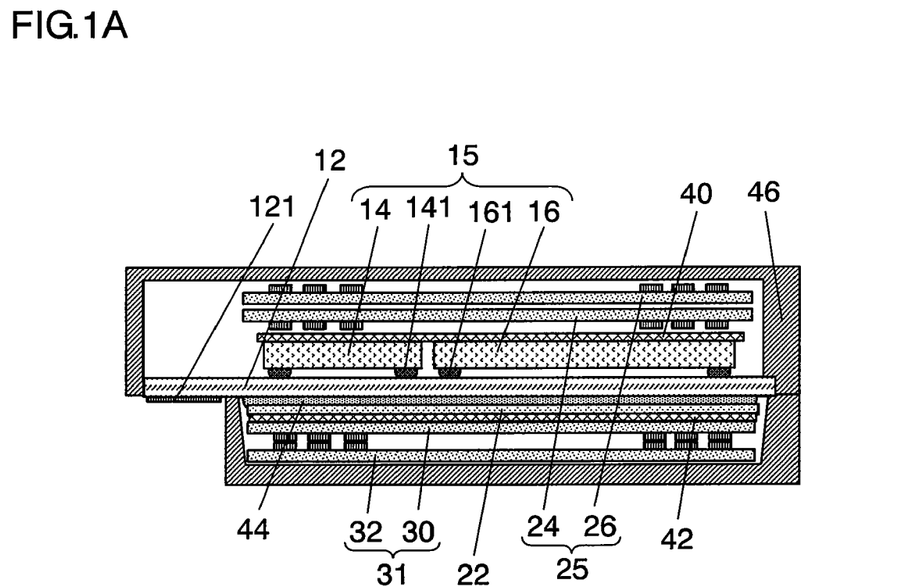
FIG. 1A is a sectional view of a storage medium with built-in antenna cut lengthwise in accordance with a first exemplary embodiment of the present invention.
Figure 1B:
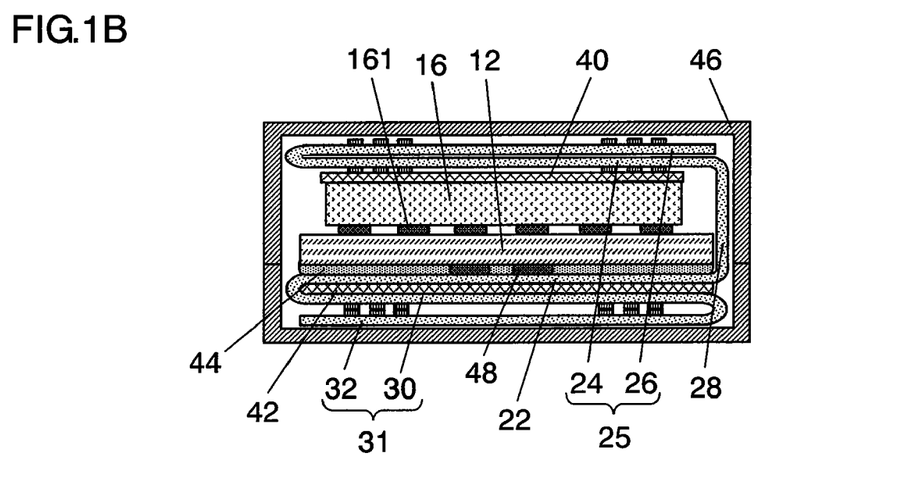
FIG. 1B is a sectional view of a storage medium with built-in antenna cut widthwise in accordance with the first exemplary embodiment of the present invention.

FIG. 1A is a sectional view of a storage medium with built-in antenna cut lengthwise in the first exemplary embodiment of the present invention. FIG. 1B is a sectional view of the storage medium with built-in antenna cut widthwise in the first exemplary embodiment of the present invention.

The storage medium with built-in antenna in the first exemplary embodiment includes semiconductor element 15 having a communication function for sending and receiving signals to and from external equipment (not illustrated) via first antenna coil 25 and second antenna coil 31; circuit board 12 on which this semiconductor element 15 is placed; first magnetic layer 40 and second magnetic layer 42 that sandwich semiconductor element 15 and circuit board 12 and are larger than semiconductor element 15; first antenna coil 25 disposed on the first magnetic layer 40, second antenna coil 31 disposed on second magnetic layer 42; and casing 46 for housing these components.

First antenna coil 25 and second antenna coil 31 are integrally formed on a single flexible sheet and are connected in parallel. As shown in FIG. 1B, first antenna coil 25 is folded at the side of first magnetic layer 40 and second antenna coil 31 is folded at the side of second magnetic layer 42 with reference to mounting area 22 where circuit board 12 is mounted. In this folded state, the coils are wound in the same direction when seen from each face. First antenna coil 25 and second antenna coil 31 are electrically connected to the same terminal of semiconductor element 15.

In this exemplary embodiment, first antenna coil 25 and second antenna coil 31 have the same number of windings.

Circuit board 12 is formed of a base material different from the flexible sheet on which first antenna coil 25 and second antenna coil 31 are formed, and has at least a wiring pattern (not illustrated) on both faces. Semiconductor element 15 is disposed on one face of circuit board 12. An electrode terminal (not illustrated) for connecting first antenna coil 25 and second antenna coil 31 is provided on the other face.

Circuit board 12 also has external connecting terminal 121 for connecting to external equipment (not illustrated). External connecting terminal 121 enables the sending and receiving of signals with external equipment by means of a contact method.

Semiconductor element 15 is configured with two semiconductor chips in this exemplary embodiment. More specifically, semiconductor element 15 is configured with the semiconductor chip including semiconductor memory 16 and control LSI 14. Control LSI 14 includes a communication function for sending and receiving signals to and from external equipment (not illustrated) via first antenna coil 25 and second antenna coil 31, a control function for controlling semiconductor memory 16, and a communication function for sending and receiving signals to and from external equipment via the external connecting terminal.

Control LSI 14 and semiconductor memory 16 are connected to an electrode terminal (not illustrated) formed on circuit board 12 by bumps 141 and 161. Underfill resin may also be provided between control LSI 14 and circuit board 12, and between semiconductor memory 16 and circuit board 12.

To connect first antenna coil 25 and second antenna coil 31, the electrode terminal (not illustrated) provided on circuit board 12 and a connecting terminal provided in mounting area 22 of the flexible sheet are electrically connected by bump 48. In addition, circuit board 12 and mounting area 22 of the flexible sheet are mechanically fixed by using insulating adhesive 44.

As shown in FIG. 1B, first antenna coil 25 and second antenna coil 31 formed on the flexible sheet protrude in two directions planarly with reference to mounting area 22 where circuit board 12 is mounted, and are then folded. More specifically, first antenna coil 25 has two coil patterns 24 and 26. In the same way, second antenna coil 31 has two coil patterns 30 and 32. Coil patterns 24 and 26 of first antenna coil 25 and coil patterns 30 and 32 of second antenna coil 31 are connected in parallel, respectively, and are folded to enable them to be housed in casing 46.

First antenna coil 25 and second antenna coil 31 are set to have the same number of windings in the same winding direction when folded.

With this structure, the storage medium with built-in antenna in this exemplary embodiment has uniform sending and receiving sensitivity to a reader (not illustrated) regardless of whether the surface or rear face is facing the reader. In addition, even if semiconductor element 15 is provided nearby, its detrimental effect on sending and receiving characteristic can be mostly eliminated by providing first magnetic layer 40 and second magnetic layer 42. Consequently, a user-friendly storage medium with built-in antenna that demonstrates good characteristics is achievable.

Next, a method of manufacturing the storage medium with built-in antenna in this exemplary embodiment is described with reference to FIGS. 2, 3A, and 3B.

Figure 2:
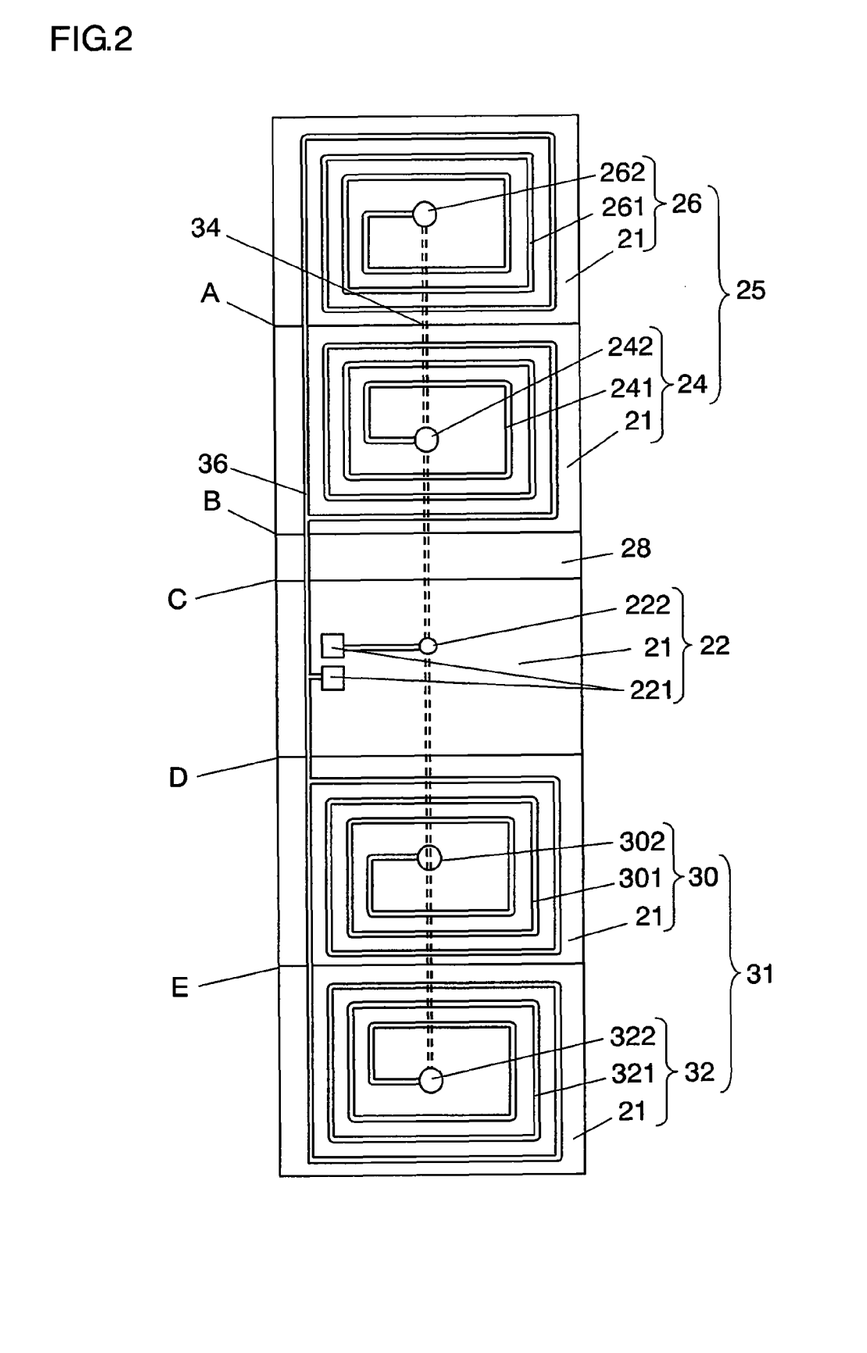
FIG. 2 is a plan view of the storage medium with built-in antenna in accordance with the first exemplary embodiment, illustrating a state whereby coil patterns configuring a first antenna coil and a second antenna coil are formed in two directions on a flexible sheet, centering on a mounting area.

FIG. 2 is a plan view illustrating coil patterns 24, 26, 30, and 32 that configure first antenna coil 25 and second antenna coil 31 in two directions, centering on mounting area 22 of flexible sheet 21.

Figure 3A:
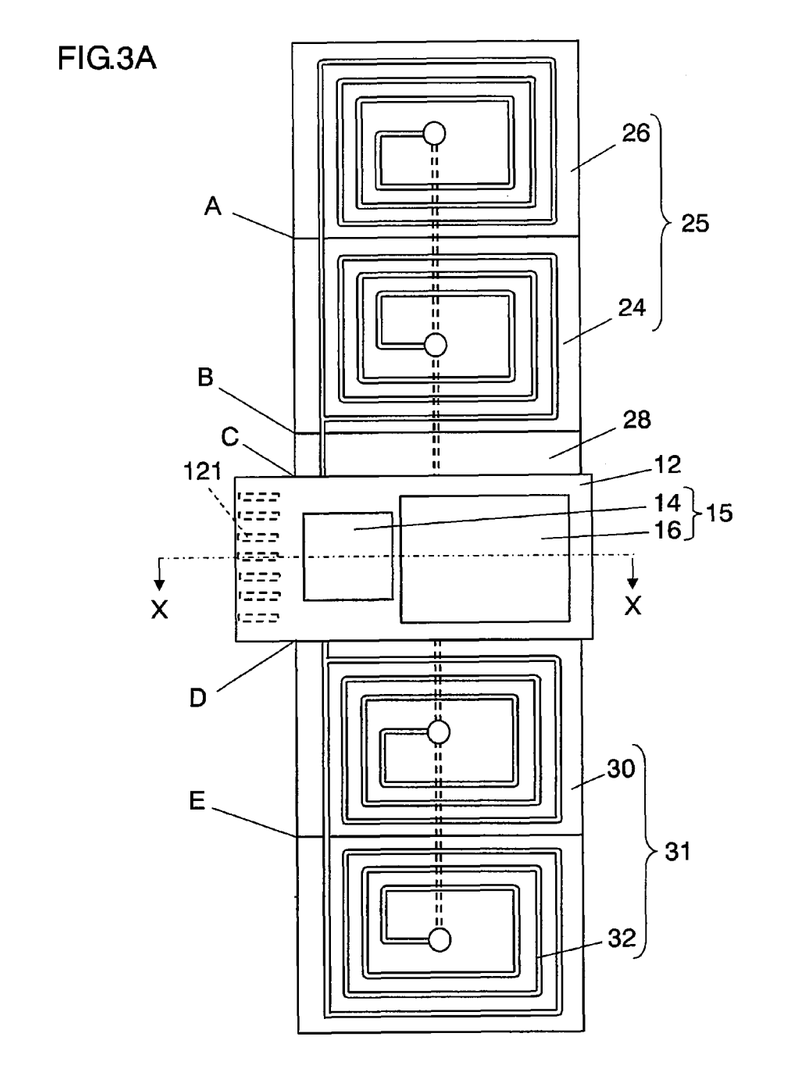
FIG. 3A is a plan view of the storage medium with built-in antenna in accordance with the first exemplary embodiment, illustrating a state whereby a circuit board on which a semiconductor element is mounted is placed on a mounting area of the flexible sheet.

FIG. 3A is a plan view illustrating a state whereby circuit board 12 on which semiconductor element 15 is mounted is placed on mounting area 22. FIG. 3B is a sectional view of FIG. 3A taken along line X-X.

In this exemplary embodiment, first antenna coil 25 and second antenna coil 31 are formed centering on mounting area 22 and extending in two directions.

First antenna coil 25 is configured with two coil patterns 24 and 26. Coil patterns 24 and 26 are formed such that their coil winding directions become the same when first antenna coil 25 is folded. In other words, coil 241 of coil pattern 24 is formed on one surface of flexible sheet 21 in a position away from mounting area 22 only for the area of interval adjustment section 28. The other coil pattern 26 is provided adjacent to coil pattern 24, and coil 261 is formed in mirror symmetry to coil 241 with reference to folding line A.

Second antenna coil 31 is configured with two coil patterns 30 and 32, which are formed such that their coil winding directions become the same when second antenna coil 31 is folded. In other words, coil 301 of coil pattern 30 is formed on one surface of flexible sheet 21 adjacent to mounting area 22 in coil pattern 30.

Another coil pattern 32 is provided adjacent to coil pattern 30, and coil 321 is formed in mirror symmetry to coil 301 with reference to folding line E.

As shown in FIG. 2, in this first exemplary embodiment, coils 241, 261, 301, and 321 are formed on one surface of flexible sheet 21, and one terminal of each of the coils is connected to rear wiring conductor 34 formed on the other face via through conductors 242, 262, 302, and 322. The other terminal of each of these coils is connected to surface wiring conductor 36 formed on the face where coils 241, 261, 301, and 321 are formed.

Rear wiring conductor 34 is connected to connecting terminal 221 on the surface via through conductor 222 provided on mounting area 22. Surface wiring conductor 36 is also connected to another connecting terminal 221. This wiring structure achieves parallel connection of first antenna coil 25 and second antenna coil 31. Coil patterns 24 and 26 configuring first antenna coil 25 and coil patterns 30 and 32 configuring second antenna coil 31 are also connected in parallel, respectively.

Figure 3B:
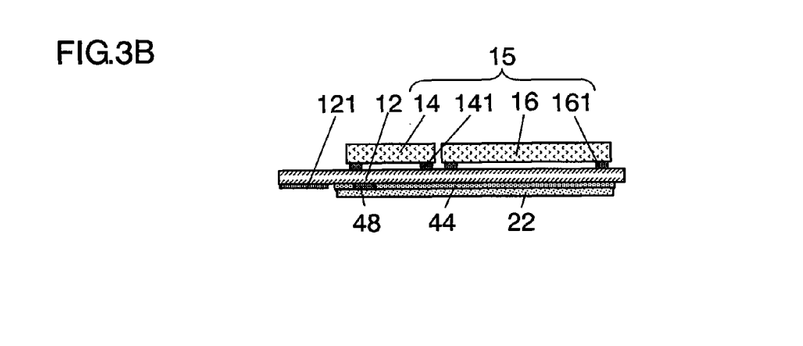
FIG. 3B is a sectional view of the storage medium with built-in antenna in accordance with the first exemplary embodiment, illustrating a state whereby a circuit board on which a semiconductor element is mounted is placed on the mounting area of the flexible sheet.

As shown in FIG. 3B, the electrode terminal (not illustrated) provided on circuit board 12 and connecting terminal 221 provided on mounting area 22 are connected, for example, by bump 48 on mounting flexible sheet 21 on circuit board 12. At the same time, the entire surface is adhered and fixed by using insulating adhesive 44.

Semiconductor element 15, first antenna coil 25, and second antenna coil 31 are electrically connected through the above steps. At the same time, circuit board 12 and mounting area 22 are mechanically connected. In this state, electrical connection between semiconductor element 15 and first antenna coil 25, and between semiconductor element 15 and second antenna coil 31 can also be inspected.

Next, procedures for housing these components in casing 46, as shown in FIGS. 1A and 1B, are described.

First, a method of folding first antenna coil 25 is described with reference to FIG. 3A.

Interval adjustment section 28 is first folded toward semiconductor element 15, with reference to folding line C, almost perpendicularly to circuit board 12. The length of interval adjustment section 28 is determined including the thickness of circuit board 12 and the folding allowance.

Next, coil pattern 24 is folded with reference to folding line B such that coil pattern 24 is positioned at semiconductor element 15. A magnetic sheet, which becomes first magnetic layer 40, is provided on the surface of semiconductor element 15 before folding. This magnetic sheet may be adhered in advance to a face of coil pattern 24 where coil 241 is formed.

Then, coil pattern 26 is folded with reference to folding line A such that coil pattern 26 and coil pattern 24 are overlaid.

This completes the folding of first antenna coil 25.

Next, how second antenna coil 31 is folded is described with reference to FIG. 3A.

First, coil pattern 30 is folded with reference to folding line D such that it attaches to second magnetic layer 42. Then, coil pattern 32 is folded with reference to folding line E such that it attaches to coil pattern 30.

This completes the folding of second antenna coil 31. The length of each of coil patterns 24, 26, 30, and 32 is set taking the folding allowance into account.

The folded coil patterns are inserted in casing 46 and sealed to complete the storage medium with built-in antenna, as shown in FIGS. 1A and 1B.

A resin sheet such as polyethylene terephthalate (PET), polyethylene terephthalate glycol (PETG), and polyimide are often used as flexible sheet 21. The thickness of the sheet is preferably between 10 μm and 100 μm.

Coils 241, 261, 301, and 321; through conductors 242, 262, 302, 322, and 222; rear wiring conductor 34; and surface wiring conductor 36 are formed, for example, by printing silver paste. A deposition method or both deposition and plating methods can also be used. Alternatively, a copper foil may be adhered and patterned by etching. The thickness is preferably between 5 μm and 20 μm.

An insulating protective film is preferably formed on these conductive faces.

A general glass epoxy resin board, a multilayer wiring board using aramide resin, or a ceramic board may be used for circuit board 12.

Still more, first magnetic layer 40 and second magnetic layer 42 may be formed using magnetic sheets made of a mixture of ferrite powder and epoxy resin, and attaching the magnetic sheets to the face of coil pattern 24 where coil 261 is formed and a rear face of coil pattern 30, respectively. Alternatively, magnetic sheets may be simply inserted in the required positions. Or, first magnetic layer 40 may be made by printing magnetic paste on the face of coil pattern 24 where coil 241 is formed. In the same way, second magnetic layer 42 may be formed by printing magnetic paste on a face of coil pattern 30 where rear wiring conductor 34 is formed.

In this exemplary embodiment, the first antenna coil and the second antenna coil are each configured by overlaying two coil patterns. However, the present invention is not limited to this structure. For example, only one coil pattern may be provided or three or more coil patterns may be folded.

This exemplary embodiment refers to an example of connecting the coils of two coil patterns in parallel, respectively, for the first antenna coil and the second antenna coil. However, a series connection is also applicable.

Also in this exemplary embodiment, multiple first antenna coils and multiple second antenna coils may be formed on a large sheet, and then cut out to the shape shown in FIG. 2. This manufacturing method enables the formation of multiple antenna coils at once, simplifying the manufacturing process.

Second Exemplary Embodiment

Figure 4A:
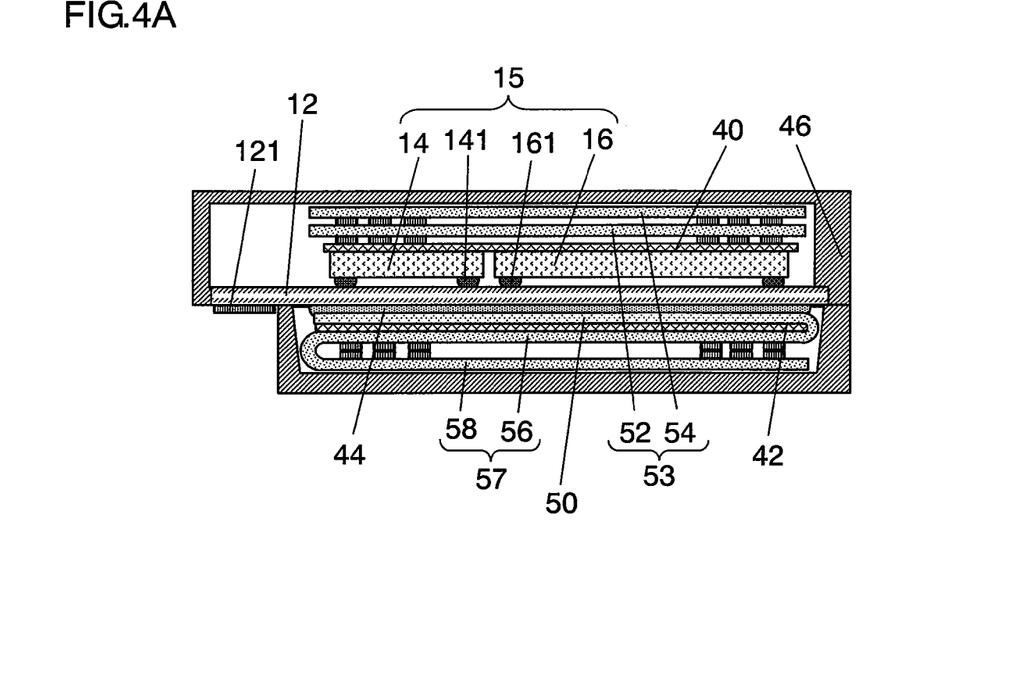
FIG. 4A is a sectional view of a storage medium with built-in antenna cut lengthwise in accordance with a second exemplary embodiment of the present invention.
Figure 4B:
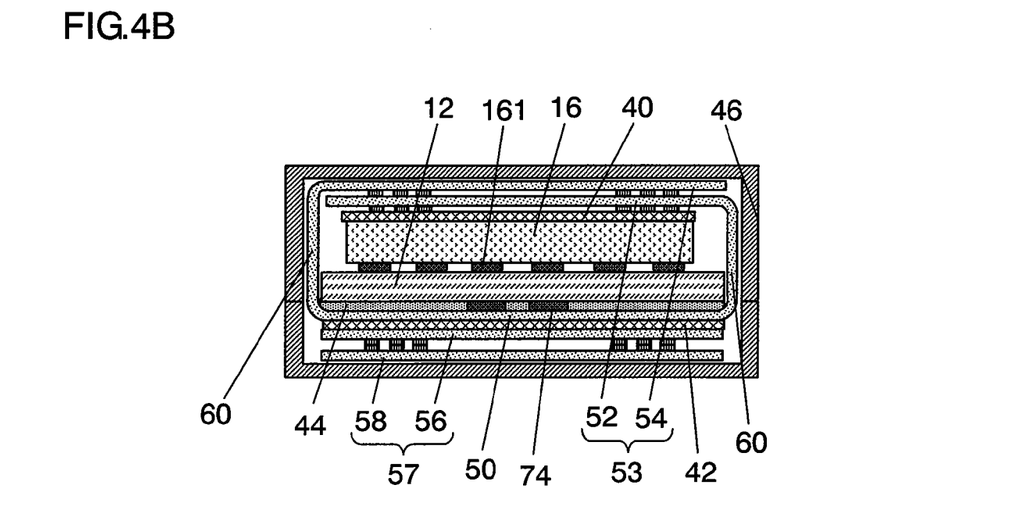
FIG. 4B is a sectional view of a storage medium with built-in antenna cut widthwise in accordance with the second exemplary embodiment of the present invention.

FIG. 4A is a sectional view of a storage medium with built-in antenna cut lengthwise in the second exemplary embodiment of the present invention, and FIG. 4B is a sectional view of the storage medium with built-in antenna cut widthwise in the second exemplary embodiment of the present invention.

The storage medium with built-in antenna in the second exemplary embodiment includes semiconductor element 15 having a communication function for sending and receiving signals to and from external equipment (not illustrated) via first antenna coil 53 and second antenna coil 57; circuit board 12 on which this semiconductor element 15 is placed; first magnetic layer 40 and second magnetic layer 42 that sandwich semiconductor element 15 and circuit board 12, and are larger than semiconductor element 15; first antenna coil 53 disposed on first magnetic layer 40; second antenna coil 57 disposed on second magnetic layer 42; and casing 46 for housing these members.

Semiconductor element 15, circuit board 12, first magnetic layer 40, second magnetic layer 42, and casing 46 of the storage medium with built-in antenna in this exemplary embodiment are the same as those of the storage medium with built-in antenna in the first exemplary embodiment.

In the storage medium with built-in antenna in the second exemplary embodiment, first antenna coil 53 and second antenna coil 57 are integrally formed on a single flexible sheet, and are connected in parallel, same as in the first exemplary embodiment. As shown in FIGS. 4A and 4B, first antenna coil 53 is folded at the side of first magnetic layer 40, and second antenna coil 57 is folded at the side of second magnetic layer 42 with reference to mounting area 50 where circuit board 12 is mounted. First antenna coil 53 and second antenna coil 57 are electrically connected to the same terminal of semiconductor element 15.

Also in this exemplary embodiment, first antenna coil 53 and second antenna coil 57 have the same number of windings. However, the number of windings need not be the same.

Circuit board 12 is formed of a base material different from flexible sheet 51 on which first antenna coil 53 and second antenna coil 57 are formed, and has at least a wiring pattern (not illustrated) on both faces. Semiconductor element 15 is disposed on one face of circuit board 12. An electrode terminal (not illustrated) for connecting first antenna coil 53 and second antenna coil 57 is provided on the other face.

Also in this exemplary embodiment, circuit board 12 has external connecting terminal 121 for connecting to external equipment (not illustrated). This external connecting terminal 121 enables the sending and receiving of signals with external equipment by means of a contact method. These are the same as the first exemplary embodiment.

Semiconductor element 15 is configured with two semiconductor chips, also in this exemplary embodiment. More specifically, semiconductor element 15 is configured with the semiconductor chip including semiconductor memory 16 and control LSI 14. Control LSI 14 has a communication function for sending and receiving signals to and from external equipment (not illustrated) via first antenna coil 53 and second antenna coil 57, a control function for controlling semiconductor memory 16, and a communication function for sending and receiving signals to and from external equipment via the external connecting terminal.

Control LSI 14 and semiconductor memory 16 are connected to the electrode terminal (not illustrated) formed on circuit board 12 by bumps 141 and 161. Here, underfill resin may be provided between control LSI 14 and circuit board 12, and between semiconductor memory 16 and circuit board 12.

To connect first antenna coil 53 and second antenna coil 57, the electrode terminal (not illustrated) provided on circuit board 12 and connecting terminal 501 provided in mounting area 50 of the flexible sheet are electrically connected by bump 74. In addition, circuit board 12 and mounting area 50 of flexible sheet 51 are mechanically fixed by using insulating resin 44.

In this exemplary embodiment, a folding structure of first antenna coil 53 and second antenna coil 57 formed on flexible sheet 51 is different from that of the first exemplary embodiment. In addition, a connecting structure of coil patterns 52 and 54 configuring first antenna coil 53 and a connecting structure of coil patterns 56 and 58 configuring second antenna coil 57 are different from that of the first exemplary embodiment.

Next, shapes of first antenna coil 53 and second antenna coil 57 in this exemplary embodiment, and their manufacturing method are described with reference to FIGS. 5 and 6.

Figure 5:
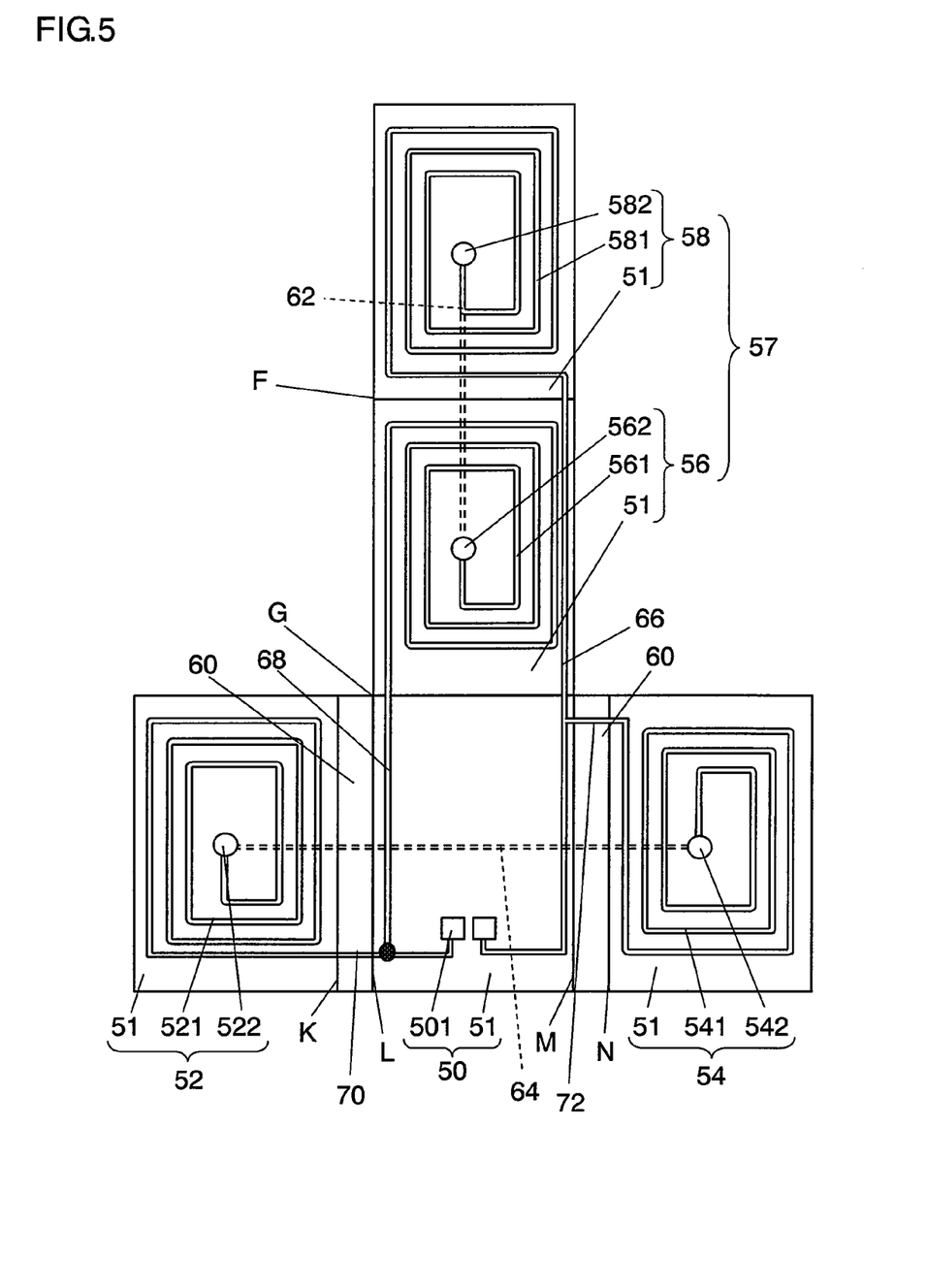
FIG. 5 is a plan view of the storage medium with built-in antenna in accordance with the second exemplary embodiment of the present invention, illustrating a state whereby coil patterns configuring a first antenna coil and a second antenna coil are formed in three directions on a flexible sheet, centering on a mounting area.

FIG. 5 is a plan view illustrating a state whereby coil patterns 52, 54, 56, and 58 that configure first antenna coil 53 and second antenna coil 57 are formed in three directions, centering on mounting area 50 of flexible sheet 51.

Figure 6:
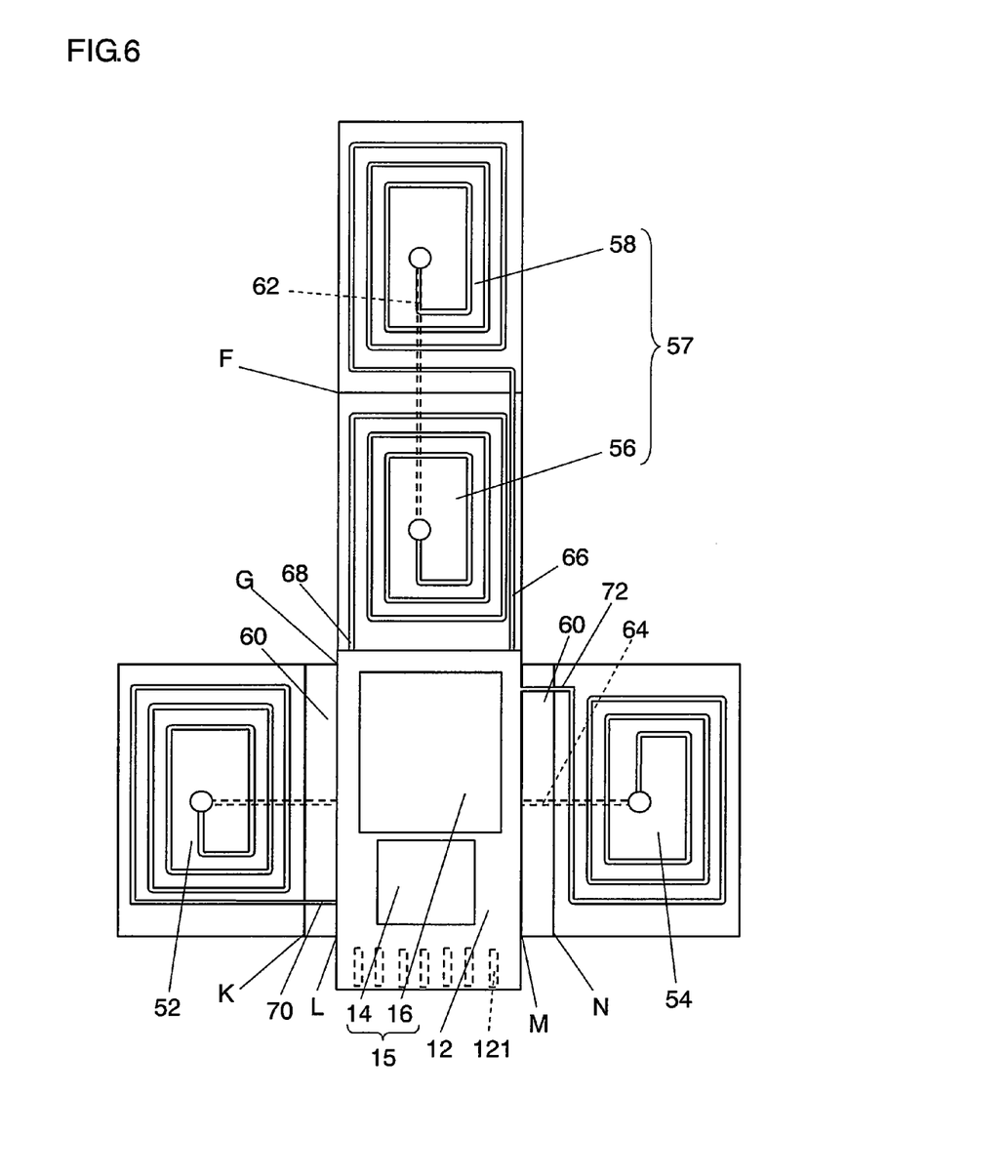
FIG. 6 is a plan view of the storage medium with built-in antenna in accordance with the second exemplary embodiment of the present invention, illustrating a state whereby a circuit board on which a semiconductor element is mounted is placed on the mounting area of the flexible sheet.

FIG. 6 is a plan view illustrating a state whereby circuit board 12 on which semiconductor element 15 is mounted is placed on mounting area 50 of flexible sheet 51.

In this exemplary embodiment, as shown in FIG. 5, coil patterns 52 and 54 configuring first antenna coil 53 are formed on both sides of mounting area 50. On the other hand, coil patterns 56 and 58 configuring second antenna coil 57 are only extended and formed on one side of mounting area 50. Coil patterns 56 and 58 configuring second antenna coil 57 are extended toward a direction opposite the direction where external connecting terminal 121 of circuit board 12 is provided.

First antenna coil 53 is configured with two coil patterns 52 and 54. These coil patterns 52 and 54 are connected in series in the same winding directions when they are folded. In other words, coil 521 of coil pattern 52 is formed on one surface of flexible sheet 51 in a position away from mounting area 50 only for the area of interval adjustment section 60. Coil 541 of another coil pattern 54 is formed on the one surface of flexible sheet 51 in a position away from mounting area 50 only for the area of interval adjustment section 60, same as coil pattern 52. One ends of these coils 521 and 541 are connected via through conductors 522 and 542 and rear wiring conductor 64. The other ends are connected to connecting terminal 501 via surface wiring conductors 70 and 72, respectively. Accordingly, first antenna coil 53 is configured such that coils 521 and 541 provided in coil patterns 52 and 54 are connected in series.

Second antenna coil 57 is configured with two coil patterns 56 and 58. These coil patterns 56 and 58 are formed such that they have the same winding directions when they are folded. In other words, coil 561 of coil pattern 56 is formed on one surface of flexible sheet 51 adjacent to mounting area 50. The other coil pattern 58 is provided adjacent to coil pattern 56, and one ends of coil 581 and coil 561 are connected via through conductors 562 and 582 and rear wiring conductor 62. The other ends are connected to connecting terminal 501 via surface wiring conductors 66 and 68, respectively. Accordingly, second antenna coil 57 is configured such that coils 561 and 581 provided in coil patterns 56 and 58 are connected in series.

On mounting circuit board 12 on flexible sheet 51, the electrode terminal (not illustrated) provided on circuit board 12 and connecting terminal 501 provided on mounting area 50 are connected, for example, by bump 74, as shown in FIG. 4B. At the same time, the entire face is attached and fixed by using insulating adhesive 44.

Semiconductor element 15, first antenna coil 53, and second antenna coil 57 are electrically connected through the above steps. At the same time, circuit board 12 and mounting area 50 are mechanically connected. Accordingly, electrical connection between semiconductor element 15 and first antenna coil 53, and between semiconductor element 15 and second antenna coil 57 can also be inspected in this state.

Next, procedures for housing these components in casing 46, as shown in FIGS. 4A and 4B, are described.

First, a method of folding first antenna coil 53 is described with reference to FIG. 5.

Interval adjustment section 60 is first folded toward semiconductor element 15 with reference to folding lines M and L almost perpendicularly to circuit board 12. Since the length of interval adjustment section 60 is determined including the thickness of circuit board 12 and folding allowance required, the length is different at the side of coil pattern 52 and at the side of coil pattern 54.

Next, coil pattern 52 is folded with reference to folding line K such that coil pattern 52 is positioned at semiconductor element 15. A magnetic sheet, which becomes first magnetic layer 40, is provided on the surface of semiconductor element 15 before folding, as shown in FIG. 4A. This magnetic sheet may be adhered in advance to a face where coil 521 of coil pattern 52 is formed.

Then, coil pattern 54 is folded with reference to folding line N such that coil pattern 52 and coil pattern 54 are overlaid.

This completes the folding of first antenna coil 53.

Next, how second antenna coil 57 is folded is described with reference to FIG. 5.

First, coil pattern 56 is folded toward mounting area 50 with second magnetic layer 42 in between with reference to folding line G. Then, coil pattern 58 is folded with reference to folding line F such that it attaches to coil pattern 56.

This completes the folding of second antenna coil 57. The length of each of coil patterns 52, 54, 56, and 58 is set taking the folding allowance into account.

The folded coil patterns are inserted in casing 46 and sealed to complete the storage medium with built-in antenna as shown in FIGS. 4A and 4B.

Coils 521 and 541 configuring first antenna coil 53 are connected in series, as described above, in this exemplary embodiment. In the same way, coils 561 and 581 configuring second antenna coil 57 are also connected in series. First antenna coil 53 and second antenna coil 57 are connected to a predetermined terminal of semiconductor element 15 in parallel. This structure enables an increase of the number of windings of first antenna coil 53 and second antenna coil 57, supporting communications using a frequency band with long wavelength.

A resin sheet such as polyethylene terephthalate (PET), polyethylene terephthalate glycol (PETG), and polyimide is often used as flexible sheet 51. The thickness of the sheet is preferably between 10 μm and 100 μm.

Coils 521, 541, 561, and 581; through conductors 522, 542, 562, and 582; rear wiring conductors 62 and 64; and surface wiring conductors 66, 68, 70, and 72 are formed, for example, by printing silver paste. A deposition method or both deposition and plating methods can also be used. Alternatively, a copper foil may be adhered and patterned by etching. The thickness is preferably between 5 μm and 20 μm.

An insulating protective film is preferably formed on these conductive faces.

Circuit board 12, first magnetic layer 40, and second magnetic layer 42 can be formed using the same materials and structures as described in the first exemplary embodiment, and thus their duplicate description is omitted here.

This exemplary embodiment refers to an example of connecting the coils of two coil patterns in series for configuring the first antenna coil and the second antenna coil, respectively. However, a parallel connection is also applicable.

Also in this exemplary embodiment, multiple first antenna coils and multiple second antenna coils may be formed on a large sheet, then cut out to the shape shown in FIG. 5. This manufacturing method enables the formation of multiple antenna coils at once, simplifying the manufacturing processes.

Third Exemplary Embodiment

Figure 7A:
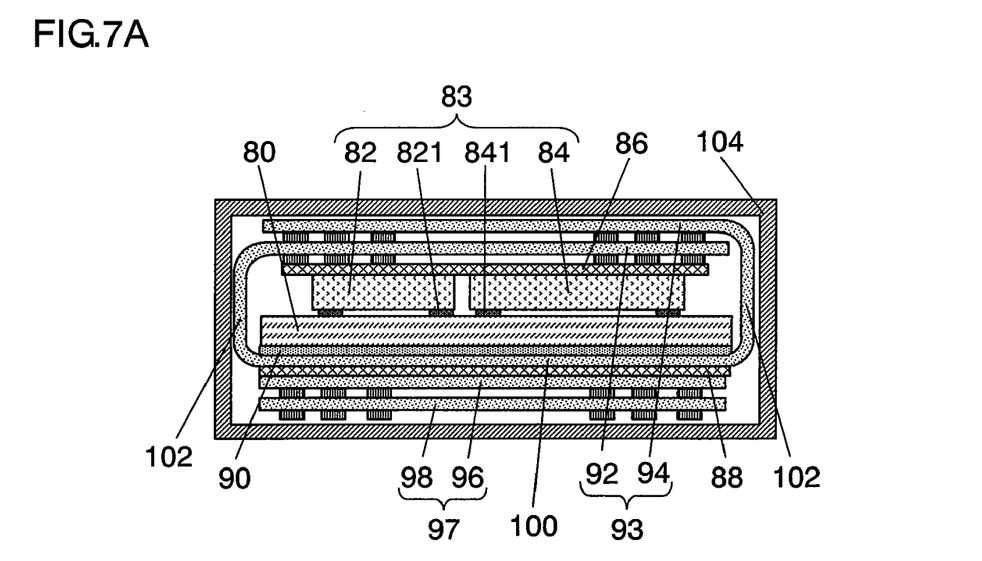
FIG. 7A is a sectional view of a storage medium with built-in antenna cut lengthwise in accordance with a third exemplary embodiment of the present invention.
Figure 7B:
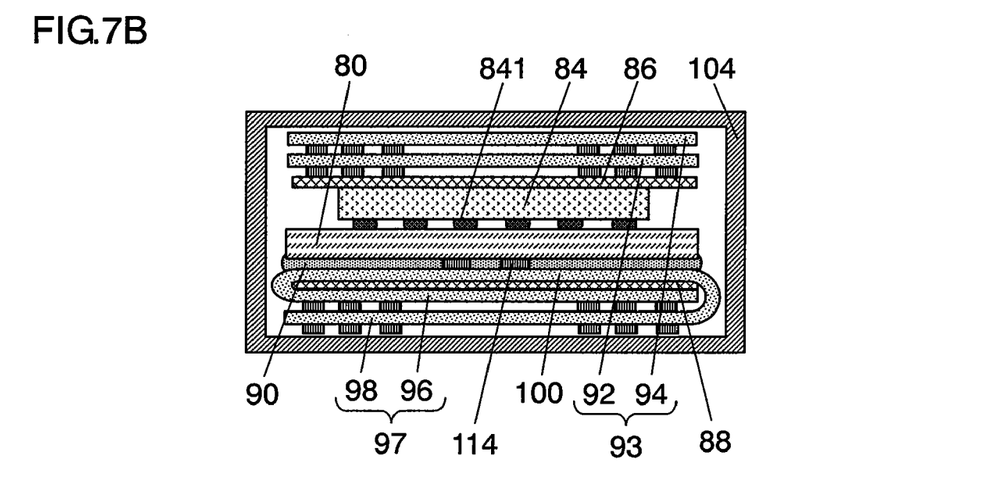
FIG. 7B is a sectional view of the storage medium with built-in antenna cut widthwise in accordance with the third exemplary embodiment of the present invention.

FIG. 7A is a sectional view of a storage medium with built-in antenna cut lengthwise in the third exemplary embodiment of the present invention. FIG. 7B is a sectional view of the storage medium with built-in antenna cut widthwise in the third exemplary embodiment of the present invention.

The storage medium with built-in antenna in this exemplary embodiment includes semiconductor element 83 having a communication function for sending and receiving signals to and from external equipment (not illustrated) via first antenna coil 93 and second antenna coil 97; circuit board 80 on which this semiconductor element 83 is placed; first magnetic layer 86 and second magnetic layer 88 that sandwich semiconductor element 83 and circuit board 80, and are larger than semiconductor element 83; first antenna coil 93 disposed on first magnetic layer 86; second antenna coil 97 disposed on second magnetic layer 88; and casing 104 for housing these components.

In the storage medium with built-in antenna in this exemplary embodiment, first antenna coil 93 and second antenna coil 97 are integrally formed on a single flexible sheet and are connected in parallel. As shown in FIGS. 7A and 7B, first antenna coil 93 is folded at the side of first magnetic layer 86 with reference to mounting area 100 where circuit board 80 is mounted. Second antenna coil 97 is folded at the side of second magnetic layer 88. In this folded state, the coils are wound in the same direction when seen from each face. First antennal coil 93 and second antenna coil 97 are electrically connected to the same terminal of semiconductor element 83.

In this exemplary embodiment, first antenna coil 93 and second antenna coil 97 have the same number of windings. However, the number of windings need not be the same.

In this exemplary embodiment, no external connecting terminal for connecting to external equipment (not illustrated) is provided on circuit board 80. Signals are sent and received via first antenna coil 93 and second antenna coil 97 by means of a non-contact method.

Circuit board 80 is formed of a base material different from flexible sheet 91 on which first antenna coil 93 and second antenna coil 97 are formed, and has at least wiring patterns (not illustrated) on both faces. Semiconductor element 83 is disposed on one face of circuit board 80. An electrode terminal (not illustrated) for connecting first antenna coil 93 and second antenna coil 97 is provided on the other face.

Semiconductor element 83 is configured with two semiconductor chips also in this exemplary embodiment. More specifically, semiconductor element 83 is configured with the semiconductor chip including semiconductor memory 84 and control LSI 82. Control LSI 82 at least has a communication function for sending and receiving signals to and from external equipment (not illustrated) via first antenna coil 93 and second antenna coil 97 and a control function for controlling semiconductor memory 84.

Control LSI 82 and semiconductor memory 84 are connected to the electrode terminal (not illustrated) provided on circuit board 80, for example, by bumps 821 and 841. Here, underfill resin may also be provided between control LSI 82 and circuit board 80, and between semiconductor memory 84 and circuit board 80.

Since no external connecting terminal is provided on circuit board 80 in the above structure, the shape of circuit board 80 can be made substantially the same as that of mounting area 100 of the flexible sheet.

To connect first antenna coil 93 and second antenna coil 97, the electrode terminal (not illustrated) provided on circuit board 80 and connecting terminal 1001 provided in mounting area 22 of the flexible sheet are electrically connected, for example, by bump 114. In addition, circuit board 80 and mounting area 100 of flexible sheet 91 are mechanically fixed by using insulating adhesive 90.

As shown in FIGS. 7A and 7B, in this exemplary embodiment, first antenna coil 93 and second antenna coil 97 formed on flexible sheet 91 protrude in four directions planarly with reference to mounting area 100 where circuit board 80 is mounted, and are then folded. More specifically, first antenna coil 93 has two coil patterns 92 and 94. In the same way, second antenna coil 97 has two coil patterns 96 and 98. Coil patterns 92 and 94 of first antenna coil 93 and coil patterns 96 and 98 of second antenna coil 97 are connected in parallel, respectively, and are folded to enable them to be housed in casing 104.

First antenna coil 93 and second antenna coil 97 are set to have the same number of windings in the same winding direction when they are folded.

With this structure, the storage medium with built-in antenna in this exemplary embodiment has uniform sending and receiving sensitivity to a reader (not illustrated) regardless of whether the surface or rear face is facing the reader. In addition, even if semiconductor element 83 is provided nearby, its detrimental effect on sending and receiving characteristic can be mostly eliminated by providing first magnetic layer 86 and second magnetic layer 88. Consequently, a user-friendly storage medium with built-in antenna that demonstrates good characteristics is achievable.

Next, a method of manufacturing the storage medium with built-in antenna in this exemplary embodiment is described with reference to FIGS. 8 and 9.

Figure 8:
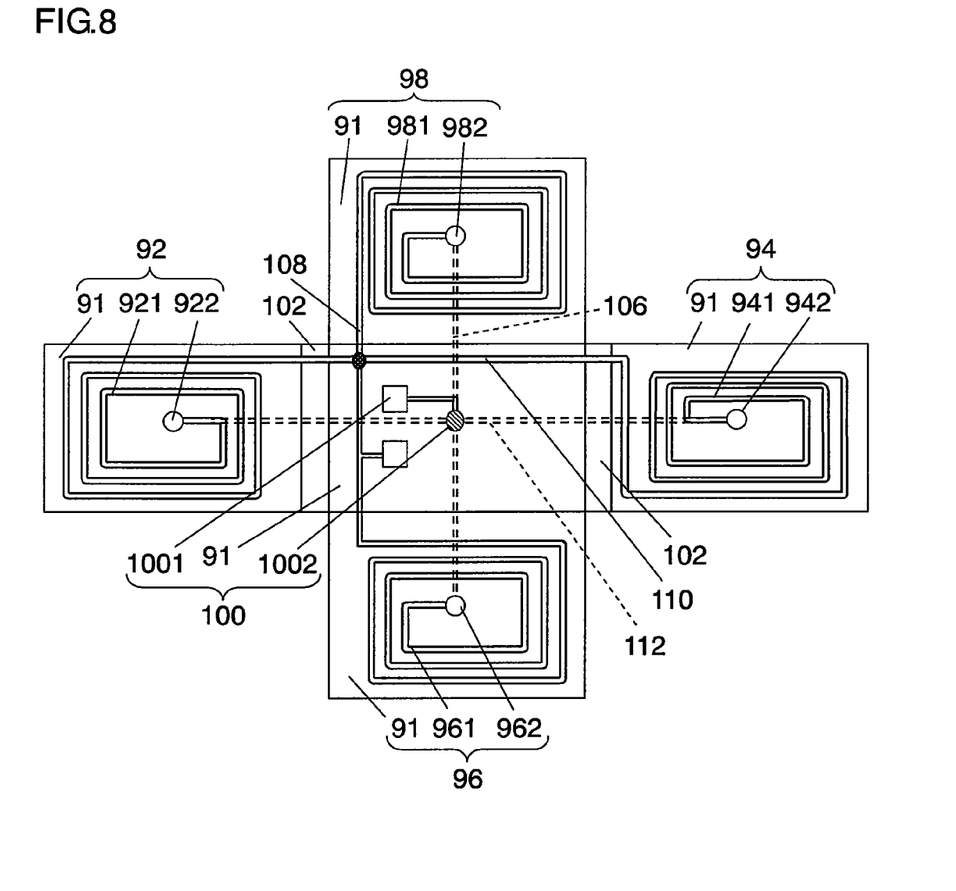
FIG. 8 is a plan view of a storage medium with built-in antenna in accordance with the third exemplary embodiment of the present invention, illustrating a state whereby coil patterns configuring a first antenna coil and a second antenna coil are formed in four directions on a flexible sheet, centering on a mounting area.

FIG. 8 is a plan view illustrating coil patterns 92, 94, 96, and 98 that configure first antenna coil 93 and second antenna coil 97 in four directions, centering on mounting area 100 of flexible sheet 91.

Figure 9:
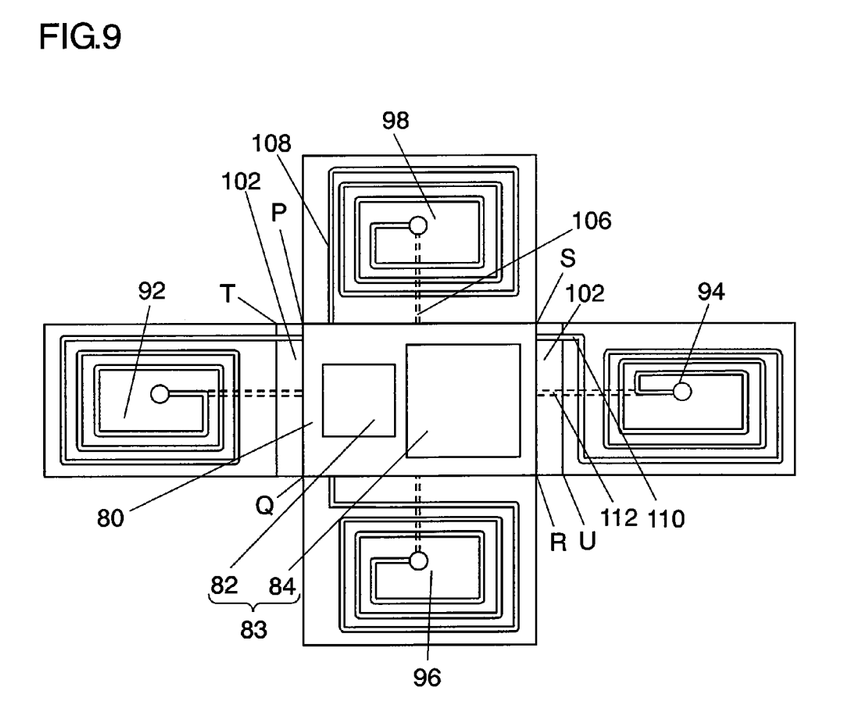
FIG. 9 is a plan view of the storage medium with built-in antenna in accordance with the third exemplary embodiment of the present invention, illustrating the state whereby a circuit board on which a semiconductor element is mounted is placed on the mounting area of the flexible sheet.

FIG. 9 is a plan view illustrating a state whereby circuit board 80 on which semiconductor element 83 is mounted is placed on mounting area 100.

First antenna coil 93 is configured with two coil patterns 92 and 94. Coil patterns 92 and 94 are formed such that their coil winding directions become the same when they are folded. In other words, coil 921 of coil pattern 92 is formed on a surface of flexible sheet 91 in a position away from mounting area 100 only for the area of interval adjustment section 102. Coil 941 of another coil pattern 94 is formed on the surface of flexible sheet 91 in a position away from mounting area 100 only for the area of interval adjustment section 102.

Second antenna coil 97 is configured with two coil patterns 96 and 98. Coil patterns 96 and 98 are formed such that their coil winding directions become the same when they are folded. In other words, coil 961 of coil pattern 96 is formed on one surface of flexible sheet 91 adjacent to mounting area 100 in coil pattern 96. Coil 981 of another coil pattern 98 is formed on one surface of flexible sheet 91 in a position adjacent to mounting area 100

As shown in FIG. 8, coils 921, 941, 961, and 981 are formed on one surface of flexible sheet 91, and one terminal of each of the coils is connected to rear wiring conductor 106 formed on the other face via through conductors 922, 942, 962, and 982. The other terminal of each of these coils is connected to surface wiring conductor 108 formed on the face where coils 921, 941, 961, and 981 are formed.

Rear wiring conductor 106 is connected to connecting terminal 1001 on the surface via through conductor 1002 provided on mounting area 100. Surface wiring conductor 108 is also connected to another connecting terminal 1001. This wiring structure achieves parallel connection of first antenna coil 93 and second antenna coil 97. Coil patterns 92 and 94 configuring first antenna coil 93 and coil patterns 96 and 98 configuring second antenna coil 97 are also connected in parallel, respectively.

As shown in FIG. 9, circuit board 80 on which semiconductor element 83 is mounted is placed on mounting area 100. On mounting circuit board 80, the electrode terminal (not illustrated) provided on circuit board 80 and connecting terminal 1001 provided on mounting area 100 are connected, for example, by bump 114. At the same time, the entire surface is adhered and fixed by using insulating adhesive 90.

Semiconductor element 83, first antenna coil 93, and second antenna coil 97 are electrically connected through the above steps. At the same time, circuit board 80 and mounting area 100 are mechanically connected. In this state, electrical connection between semiconductor element 83 and first antenna coil 93, and between semiconductor element 83 and second antenna coil 97 can also be inspected.

Next, procedures for housing these components in casing 104, as shown in FIGS. 7A and 7B, are described.

First, a method of folding first antenna coil 93 is described with reference to FIG. 9.

Interval adjustment section 102 is first folded toward semiconductor element 83 with reference to folding line P almost perpendicularly to circuit board 80. The length of interval adjustment section 102 is determined including the thickness of circuit board 80 and the folding allowance required.

Next, coil pattern 92 is folded with reference to folding line T such that it is positioned at semiconductor element 83. A magnetic sheet, which becomes first magnetic layer 86, is provided on the surface of semiconductor element 83 before folding. This magnetic sheet may be adhered in advance to a face of coil pattern 92 where coil 921 is formed.

Then, coil pattern 94 is folded with reference to folding line U such that coil pattern 92 and coil pattern 94 are overlaid. At this point, interval adjustment section 102 is folded toward semiconductor element 83 with reference to folding line R almost perpendicularly to circuit board 80, same as coil pattern 92.

This completes the folding of first antenna coil 93.

Next, how second antenna coil 97 is folded is described with reference to FIG. 9.

First, coil pattern 96 is folded such that it attaches to second magnetic layer 88 with reference to folding line Q. Then, coil pattern 98 is folded with reference to folding line S such that it attaches to coil pattern 96.

This completes the folding of second antenna coil 97. The length of each of coil patterns 92, 94, 96, and 98 is set taking the folding allowance into account.

The folded coil patterns are inserted in casing 104 and sealed to complete the storage medium with built-in antenna, as shown in FIGS. 7A and 7B.

A resin sheet such as polyethylene terephthalate (PET), polyethylene terephthalate glycol (PETG), and polyimide are often used as flexible sheet 91. The thickness of the sheet is preferably between 10 μm and 100 μm.

Coils 921, 941, 961, and 981; through conductors 922, 942, 962, 982, and 1002; rear wiring conductors 106 and 112; and surface wiring conductors 108 and 110 are formed, for example, by printing silver paste. A deposition method or both deposition and plating methods can also be used. Alternatively, a copper foil may be adhered and patterned by etching. The thickness is preferably between 5 μm and 20 μm.

An insulating protective film is preferably formed on these conductive faces.

Circuit board 80, first magnetic layer 86 and second magnetic layer 88 can be made using the same materials and same structures as described in the first exemplary embodiment, and thus their duplicate description is omitted here.

This exemplary embodiment refers to an example of connecting the coils of two coil patterns in parallel for the first antenna coil and the second antenna coil, respectively. However, a series connection is also applicable.

Also in this exemplary embodiment, multiple first antenna coils and multiple second antenna coils may be formed on a large sheet, and then cut out to the shape shown in FIG. 8. This manufacturing method enables the formation of multiple antenna coils at once, simplifying the manufacturing process.

The first to third exemplary embodiments refer to the first antenna coil and the second antenna coil with the same number of windings. However, the number of windings need not be the same. The number of windings of the first antenna coil and the second antenna coil may differ.

The first to third exemplary embodiments also refer to a structure of attaching the circuit board made of a base material different from the flexible sheet. However, the present invention is not limited to this structure. A function portion of the circuit board may be directly formed on the mounting area of the flexible sheet, and the semiconductor element is directly mounted on the mounting area.

The present invention thus offers the storage medium with built-in antenna having a satisfactory sending and receiving sensitivity on both the surface and rear face of the storage medium with built-in antenna.

In addition, provision of the built-in antenna and external connecting terminal enables both non-contact and contact communications without being limited to the non-contact communications.

Furthermore, a relatively large semiconductor chip or multiple chips can be disposed as the semiconductor element. This results in the feasibility of manufacturing tags with semiconductor chip including a sensor function and memory function in addition to conventional non-contact tags. The present invention also enables manufacturing of SD memory cards with non-contact function.

INDUSTRIAL APPLICABILITY

The storage medium with built-in antenna of the present invention achieves a non-contact storage medium or a non-contact and contact storage medium that demonstrates satisfactory communication characteristics regardless of the directions of the card for a card-type storage medium with a semiconductor element, for example an LSI such as a memory, occupying almost the same area as the antenna formation area. This is effectively applicable to fields using card-type storage media.

The invention claimed is:

1. A storage medium with built-in antenna, comprising:
a semiconductor element including a communication function for sending and receiving a signal to and from external equipment via an antenna coil;
a circuit board on which the semiconductor element is placed;
a first magnetic layer and a second magnetic layer disposed sandwiching the semiconductor element and the circuit board; the first magnetic layer and the second magnetic layer being larger than the semiconductor element;
a first antenna coil disposed on the first magnetic layer; and
a second antenna coil disposed on the second magnetic layer;
wherein the first antenna coil and the second antenna coil are connected in parallel on a single flexible sheet, the first antenna coil and the second antenna coil being folded at a side of the first magnetic layer and at a side of the second magnetic layer, respectively, and being electrically connected to the semiconductor element.

2. The storage medium with built-in antenna coil of claim 1, wherein the first antenna coil and the second antenna coil have a same number of windings.

3. The storage medium with built-in antenna coil of claim 1, wherein the first antenna coil and the second antenna coil are wound in a same direction when seen from each face in a state whereby the first antenna coil and the second antenna coil are folded at a side of the first magnetic layer and at a side of the second magnetic layer, respectively.

4. The storage medium with built-in antenna coil of claim 1, wherein the first antenna coil and the second antenna coil formed on the flexible sheet protrude planarly in one of two, three, and four directions with reference to an area where the circuit board is placed, and are then folded.

5. The storage medium with built-in antenna of claim 4, wherein the circuit board is formed of a base material separate from the flexible sheet, a wiring pattern being formed on at least both faces of the circuit board, the semiconductor element being placed on one face of the circuit board, and an electrode terminal for connecting the first antenna coil and the second antenna coil being provided on the other face of the circuit board; and
a connecting terminal is electrically connected to the electrode terminal, the connecting terminal being provided in the area of the flexible sheet where the circuit board is placed and connecting in parallel the first antenna coil and the second antenna coil.

6. The storage medium with built-in antenna of claim 5, further comprising:
an external connecting terminal on the circuit board for connecting to external equipment, the external connecting terminal being used for sending and receiving a signal to and from the external connecting terminal to the external equipment by means of a contact method.

7. The storage medium with built-in antenna of claim 6, wherein the semiconductor element further comprises a communication function for sending and receiving a signal to and from external equipment via the external connecting terminal.

8. The storage medium with built-in antenna of claim 5, wherein the semiconductor element is configured with a semiconductor chip having at least one of a communication function for sending and receiving a signal to and from external equipment via the antenna coil, a memory function, and a control function for controlling the memory function.

9. The storage medium with built-in antenna of claim 4, wherein the first antenna coil and the second antenna coil have multiple coil patterns, the coil patterns being connected in parallel to each other, and folded to configure the first antenna coil and the second antenna coil, respectively.

10. The storage medium with built-in antenna of claim 4, wherein the first antenna coil and the second antenna coil have multiple coil patterns, the coil patterns being connected in series to each other, and folded to configure the first antenna coil and the second antenna coil, respectively.

11. The storage medium with built-in antenna of claim 1, wherein the flexible sheet is integrated with the circuit board on which the first antenna coil, the second antenna coil, and the semiconductor element are placed, the first antenna coil and the second antenna coil protruding planarly in one of two, three, and four directions with reference to the circuit board, and are then folded.

12. The storage medium with built-in antenna of claim 1, further comprising a casing for covering the circuit board and housing the first antenna coil and the second antenna coil.

* * * * *